(12) United States Patent
An et al.

(10) Patent No.: US 11,508,557 B2
(45) Date of Patent: Nov. 22, 2022

(54) SEMICONDUCTOR MANUFACTURING APPARATUS HAVING AN INSULATING PLATE

(71) Applicant: SAMSUNG ELECTRONICS CO., LTD., Suwon-si (KR)

(72) Inventors: Sung-Joo An, Seongnam-si (KR); Jeon-Il Lee, Suwon-si (KR); Kaoru Yamamoto, Seongnam-si (KR); Jang-Hee Lee, Yongin-si (KR); Kee-Young Jun, Seongnam-si (KR); Geun-O Jeong, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 16/371,327

(22) Filed: Apr. 1, 2019

(65) Prior Publication Data

US 2020/0071822 A1 Mar. 5, 2020

(30) Foreign Application Priority Data

Aug. 31, 2018 (KR) .......................... 10-2018-0104008

(51) Int. Cl.
*C23C 16/00* (2006.01)
*H01L 21/306* (2006.01)
(Continued)

(52) U.S. Cl.
CPC ........ *H01J 37/32449* (2013.01); *C23C 16/46* (2013.01); *C23C 16/50* (2013.01); *H01J 37/32357* (2013.01); *H01J 37/32522* (2013.01); *H01J 37/32724* (2013.01); *H01J 37/32807* (2013.01); *H01L 21/67017* (2013.01);
(Continued)

(58) Field of Classification Search
CPC .......... H01J 37/32357; H01J 37/32522; H01J 37/32321; H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32449; H01J 37/32724; C23C 16/4557; H01L 21/67098;
(Continued)

(56) References Cited

U.S. PATENT DOCUMENTS

| 5,518,572 | A | * | 5/1996 | Kinoshita | ................ G21K 1/14 |
| | | | | | 118/723 E |
| 5,753,886 | A | * | 5/1998 | Iwamura | ........... H01J 37/32357 |
| | | | | | 219/121.43 |

(Continued)

FOREIGN PATENT DOCUMENTS

| JP | 2013-159521 | 8/2013 |
| JP | 5578548 | 7/2014 |
| JP | 2016-23128 | 2/2016 |

*Primary Examiner* — Luz L Alejandro Mulero
(74) *Attorney, Agent, or Firm* — F. Chau & Associates, LLC

(57) ABSTRACT

A semiconductor manufacturing apparatus includes a process chamber. An insulating plate divides an interior space of the process chamber into a first space and a second space and thermally isolates the first space from the second space. A gas supplier is configured to supply a process gas to the first space. A radiator is configured to heat the first space. A stage is disposed within the second space and the stage is configured to support a substrate.

18 Claims, 19 Drawing Sheets

(51) Int. Cl.
  *H01J 37/32* (2006.01)
  *H01L 21/67* (2006.01)
  *C23C 16/50* (2006.01)
  *C23C 16/46* (2006.01)
(52) U.S. Cl.
  CPC .. *H01L 21/67103* (2013.01); *H01L 21/67115* (2013.01); *H01J 2237/3321* (2013.01)
(58) Field of Classification Search
  CPC ......... H01L 21/67109; H01L 21/67103; H01L 21/67115
  See application file for complete search history.

(56) References Cited

U.S. PATENT DOCUMENTS

| | | | | |
|---|---|---|---|---|
| 6,095,083 | A * | 8/2000 | Rice | H01J 37/32706 118/715 |
| 6,176,929 | B1 * | 1/2001 | Fukunaga | C23C 16/4412 118/715 |
| 8,591,680 | B2 | 11/2013 | Veerasamy | |
| 9,156,699 | B2 | 10/2015 | Yamada et al. | |
| 9,702,039 | B2 | 7/2017 | Nishide et al. | |
| 2006/0042545 | A1 * | 3/2006 | Shibata | H01J 37/32357 118/722 |
| 2006/0231032 | A1 * | 10/2006 | Murakami | C23C 16/5096 700/121 |
| 2008/0057344 | A1 * | 3/2008 | Murakami | C23C 16/34 427/255.391 |
| 2008/0178805 | A1 * | 7/2008 | Paterson | H01J 37/32357 118/723 I |
| 2010/0212728 | A1 | 8/2010 | Hori et al. | |
| 2012/0090784 | A1 * | 4/2012 | Ouye | H01J 37/32522 156/345.37 |
| 2013/0228283 | A1 * | 9/2013 | McChesney | H01J 37/321 438/689 |
| 2014/0231671 | A1 * | 8/2014 | Lu | H01L 21/67115 250/455.11 |
| 2014/0262755 | A1 * | 9/2014 | Deshmukh | H01J 37/32431 204/192.35 |
| 2016/0372305 | A1 * | 12/2016 | Uemura | H01J 37/3288 |
| 2017/0029942 | A1 * | 2/2017 | Matsumoto | B82Y 40/00 |
| 2017/0229290 | A1 * | 8/2017 | Kobayashi | H01L 21/67115 |
| 2018/0090345 | A1 * | 3/2018 | Kouzu | H01L 21/67115 |
| 2018/0342374 | A1 * | 11/2018 | Liang | H01J 37/32449 |

* cited by examiner

SEMICONDUCTOR MANUFACTURING APPARATUS HAVING AN INSULATING PLATE

CROSS-REFERENCE TO RELATED APPLICATION

This application claims the benefit of and priority to Korean Patent Application No. 10-2018-0104008, filed on Aug. 31, 2018, in the Korean Intellectual Property Office, the disclosure of which is herein incorporated by reference in its entirety.

TECHNICAL FIELD

The present disclosure relates to a semiconductor manufacturing apparatus and, more specifically, to a semiconductor manufacturing apparatus having an insulating plate.

DISCUSSION OF THE RELATED ART

Graphene is a form of carbon in which carbon atoms are arranged in a two-dimensional thin film having a honeycomb structure. In graphene, the carbon atoms form a carbon hexagonal plane having a two-dimensional structure in which carbon atoms have a $sp^2$ orbital hybridization. The aggregate of carbon atoms having this planar structure is referred, to as graphene, and the thickness of graphene is about 0.34 nm, which corresponds to the thickness of only one carbon atom. Graphene is structurally and chemically very stable and is an excellent conductor of electricity that has a charge mobility that is about 100 times faster than silicon, and may allow a flow of current that is about 100 times greater than that of copper. In addition, graphene has excellent transparency and may have higher transparency than indium tin oxide (ITO), which is often used conventionally as a transparent electrode. Various studies have been conducted to apply graphene to electronic devices based on the characteristics of graphene.

In recent years, attempts have been made to manufacture a semiconductor device including a graphene film by directly growing graphene on a substrate by using chemical vapor deposition (CVD). The method of directly growing graphene may be desirable in that a graphene transfer process may be omitted, but a substrate and/or a material film on the substrate may be prone to deterioration during direct graphene growth as a high growth temperature is generally used for obtaining high-quality graphene.

SUMMARY

A semiconductor manufacturing apparatus includes a process chamber. An insulating plate divides an interior space of the process chamber into a first space and a second space and thermally isolates the first space from the second space. A gas supplier, is configured to supply a process gas to the first space. A radiator is configured to heat the first space. A stage is disposed within the second space and is configured to support a substrate therein.

A semiconductor manufacturing apparatus includes a process chamber. An insulating plate divides an interior space of the process chamber into a first space, in which plasma is generated, and a second space, in which the plasma generated in the first space is diffused. A gas supplier is configured to supply a process gas to the first space. A plasma generator is configured to generate plasma from the process gas supplied to the first space. A radiator is configured to heat the first space to a first temperature. A stage is configured to support a substrate within the second space and is configured to heat the substrate to a second temperature that is less than the first temperature.

A semiconductor manufacturing apparatus includes a process chamber having a first space in which plasma is generated and a second space in which, a substrate is processed. An insulating plate thermally isolates the first space from the second space and includes a first through hole through which plasma is transmitted from the first space to the second space. A gas supplier is configured to supply a process gas including carbon into the first space. A plasma generator is configured to generate plasma, in the first space, from the process gas. A radiator is configured to heat the first space to a first temperature while the plasma is generated in the first space. A stage is configured to support the substrate within the second space and is additionally configured to heat the substrate to a second temperature that is less than the first temperature.

BRIEF DESCRIPTION OF THE DRAWINGS

Exemplary embodiments of the present inventive concept will be more clearly understood from the following detailed description taken in conjunction with the accompanying drawings in which.

DETAILED DESCRIPTION OF THE EMBODIMENTS

Figure 1:
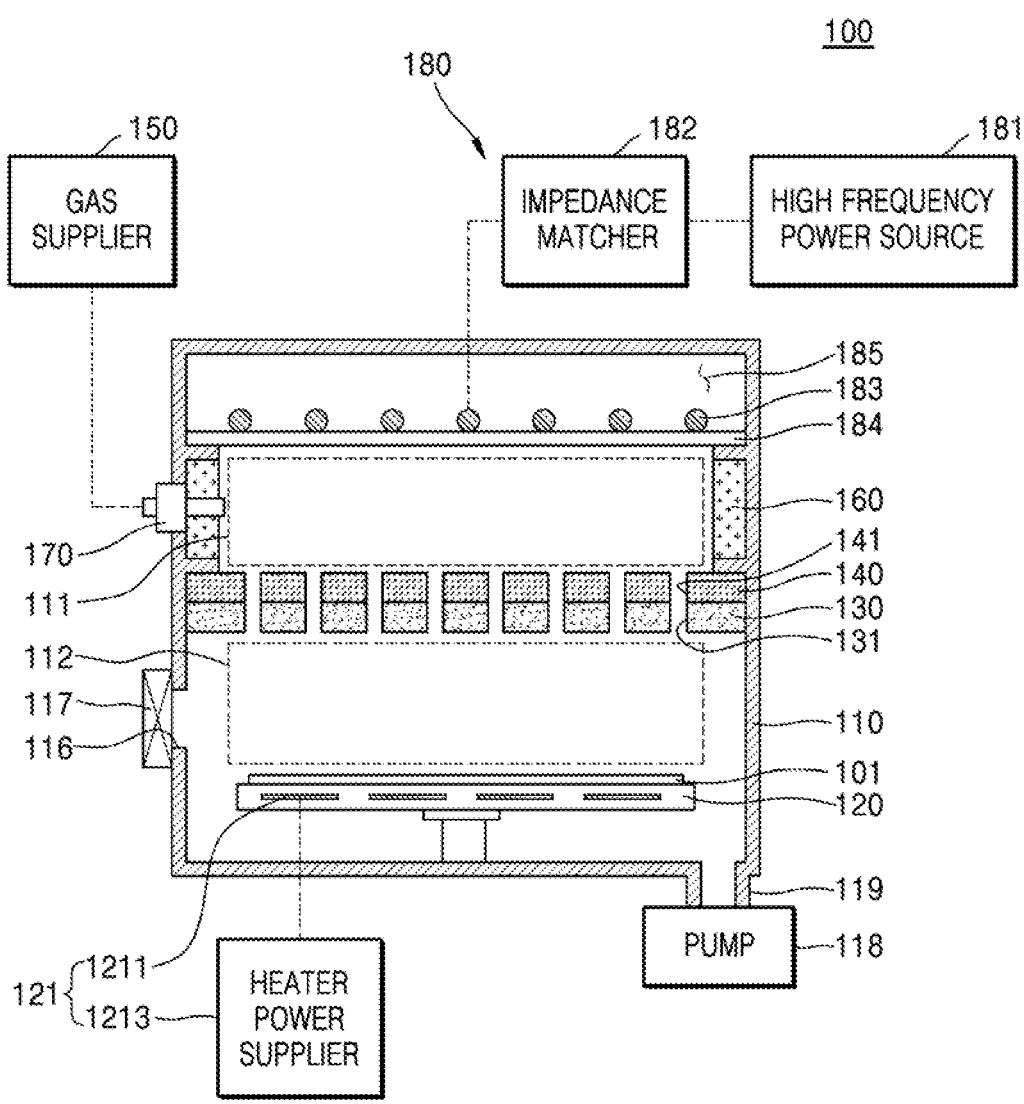
FIG. 1 is a cross-sectional view illustrating a semiconductor manufacturing apparatus according to exemplary embodiments of the present inventive concept.

Hereinafter, embodiments of the inventive concept will be described in detail with reference to the accompanying drawings. In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. In the drawings and detailed description, the same or similar elements may be denoted by the same reference numerals.

FIG. 1 is a cross-sectional view illustrating a semiconductor manufacturing apparatus 100 according to exemplary embodiments of the present inventive concept.

Referring to FIG. 1, the semiconductor manufacturing apparatus 100 may include a process chamber 110, a stage 120, an insulating plate 130, a reflector 140, a gas supplier 150, a radiator 160, a gas injector 170, and a plasma generator 180.

The semiconductor manufacturing apparatus 100 may be a plasma processing apparatus that is configured to processes a substrate 101 in the process chamber 110 by using plasma. For example, the semiconductor manufacturing apparatus 100 may be a plasma deposition apparatus for depositing a material layer on the substrate 101, and the processing chamber 110 may be a plasma deposition chamber for performing a plasma deposition process. For example, the semiconductor manufacturing apparatus 100 may be configured to grow a graphene film on the substrate 101 by using plasma, and also may be configured to manufacture a semiconductor device by depositing a graphene film on the substrate 101 by using plasma. However, the use of the semiconductor manufacturing apparatus 100 according to the present invention is not limited thereto. For example, the semiconductor manufacturing apparatus 100 may perform an etching process, a cleaning process, and the like.

The substrate 101 may be a wafer, for example, a silicon substrate. For example, the semiconductor manufacturing apparatus 100 may be configured to deposit a material film on a silicon substrate. In exemplary embodiments of the present inventive concept, the semiconductor manufacturing apparatus 100 may be configured to directly grow a graphene film on a silicon substrate by using plasma.

The process chamber 110 may define an interior space. The interior space of the process chamber 110 may be partitioned into a first space 111 and a second space 112 by the insulating plate 130 and/or the reflector 140. The first space 111 is a space provided above the insulating plate 130 and/or the reflector 140 and may be a space where plasma is generated. The second space 112 is a space provided below the insulating plate 130 and/or the reflector 140. The second space 112 may be a space where the plasma generated in the first space 111 is diffused and the substrate 101 is processed.

An exhaust pipe 119 may be provided at a lower portion of the process chamber 110 and may be connected to a vacuum pump 118. The vacuum pump 118 may adjust the pressure of the interior space of the process chamber 110 such that a pressure atmosphere suitable for plasma generation and/or plasma processing is formed in the interior space of the process chamber 110. A gate valve 117 is configured to open and close an opening 116 through which the substrate 101 is carried in and carried out. The gate valve 117 may be disposed on the side wall, of the process chamber 110.

The stage 120 may be disposed in the second space 112 in the process chamber 110. The substrate 101 may be disposed on the upper surface of the stage 120. The stage 120 may support the substrate 101 during plasma processing. In addition, the stage 120 may serve as an electrode during the plasma processing. For example, when a bias power is applied to the stage 120 during the plasma processing, the stage 120 may serve as an electrode.

In exemplary embodiments of the present inventive concept, the stage 120 may include aluminium nitride (AlN), aluminium (Al), silicon carbide (SiC), stainless steel, or a combination thereof.

The stage 120 may include a stage heater 121. The stage 120 may drive the stage heater 121 to thereby heat the substrate 101 supported by the stage 120 and also to thereby heat the second space 112. For example, the stage heater 121 may be configured to heat the substrate 101 to a temperature suitable for processing the substrate 101 during the plasma processing.

The stage heater 121 may include a heating electrode 1211. The heating electrode 1211 may be embedded in the stage 120. For example, the heating electrode 1211 may have a concentric or helical pattern with respect to the central axis of the stage 120. The heating electrode 1211 may include a conductor of electricity, for example, a metal such as tungsten (W), copper (Cu), nickel (Ni), molybdenum (Mo), titanium (Ti), nickel-chromium (Ni—Cr) alloy, or nickel-aluminium (Ni—Al) alloy or an electrically conductive ceramic such as tungsten carbide (WC), molybdenum carbide (MoC), or titanium nitride (TiN).

The stage heater 121 may be electrically connected to a heater power supplier 1213. The heater power supplier 1213 may apply power (e.g., an AC voltage) to the heating electrode 1211 to thereby heat the heating electrode 1211. The temperature of the stage 120 and the substrate 120 supported by the stage 120 may be adjusted by the heated heating electrode 1211.

Figure 2:
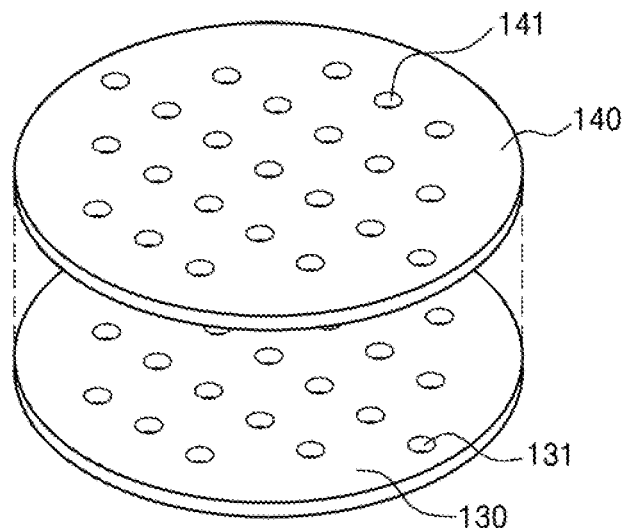
FIG. 2 is a perspective view illustrating an insulating plate and a reflector, shown in FIG. 1.

FIG. 2 is a perspective view illustrating the insulating plate 130 and the reflector 140 shown in FIG. 1.

Referring to FIGS. 1 and 2, the insulating plate 130 may be provided in the process chamber 110 and may divide an interior space of the process chamber 110 into the first space 111 and the second space 112. For example, the insulating plate 130 may be installed in the process chamber 110 to horizontally extend in the interior space of the process chamber 110. The insulating plate 130 may be disk-shaped and may include one or more first through holes 131 that allows plasma generated in the first space 111 to pass into the second space 112.

The insulating plate 130 may be configured to thermally isolate the first space 111 from the second space 112. Since the first space 111 and the second space 112 may be thermally separated from each other by the insulating plate 130, the temperature of the second space 112 may be maintained at a temperature lower than the temperature of the first space 111, even if the first space 111 in which plasma is generated has a relatively high temperature.

For example, the insulating plate 130 may include a low thermal conductivity material. For example, the insulating plate 130 may include ceramic, quartz, and the like.

The reflector 140 may be provided on the insulating plate 130. The reflector 140 may cover the upper surface of the insulating plate 130. For example, the reflector 140 may be installed in the process chamber 110 to horizontally extend in the interior space of the process chamber 110, for example, in a manner similar to that of the insulating plate 130. The reflector 140 may be plate-shaped and may include at least one second through hole 141 that allows plasma generated in the first space 111 to pass into the second space 112. The second through hole 141 of the reflector 140 may communicate with the first through hole 131 of the insulating plate 130.

The reflector 140 may thermally isolate the first space 111 from the second space 112 together with the insulating plate 130. The reflector 140 may block radiant heat transfer between the first space 111 and the second space 112. For example, the reflector 140 may reflect infrared rays travelling from the first space 111 to the second space 112 to suppress radiation heat transfer between the first e 111 and the second space 112. Since the radiation heat transfer is blocked between the first space 111 and the second space 112 by the reflector 140, even when the first space 111 has a higher temperature than the second space 112, the temperature of the second space 112 may be maintained at a temperature lower than the temperature of the first space 111.

Referring back to FIG. 1, the gas supplier 150 may supply a process gas to the first space 111 of the process chamber 110. For example, the gas supplier 150 may supply a source gas, a purge gas, or the like to the first space 111. As shown in FIG. 1, the gas supplier 150 may be connected to the gas injector 170 provided on the side wall of the process chamber 110 and may supply a process gas to the first space 111 through the gas injector 170. Alternatively, the gas supplier 150 may supply a process gas to the first space 111 through the top wall of the process chamber 110.

For example, the gas supplier 150 may include an inert gas supply source for supplying an inert gas for plasma generation. For example, the inert gas supply source may be configured to supply Ar, He, Ne, Kr, Xe, etc. to the first space 111. The inert gas supplied by the gas supplier 150 may be plasmatized in the first space 111 by the plasma generator 180.

In addition, the gas supplier 150 may include a source gas supply source for supplying a source gas, for example, a deposition source gas or an etch source gas.

The radiator 160 may heat the first space 111 of the process chamber 110. For example, the radiator 160 may be installed on the side wall of the process chamber 110. The radiator 160 may provide a temperature atmosphere suitable for generating radicals having high activation energy. For example, the radiator 160 may heat the first space 111 to a high temperature so that radicals generated from a process gas in the first space 111 have higher activation energies.

The gas injector 170 may be connected to the gas supplier 150 and may inject a process gas supplied through the gas supplier 150 into the first space 111. For example, the gas injector 170 may be installed on the side wall of the process chamber 110 and may be configured to inject a process gas in an inward direction of the first space 111.

The plasma generator 180 may generate plasma in the first space 111. The plasma generator 180 may generate an electric field in the first space 111 and thus generate plasma from the process gas in the first space 111. The plasma generator 180 may generate plasma in the first space 111, for example, through a direct plasma method. The direct plasma method may refer to a method of generating plasma directly in the process chamber 110, which is a substrate processing space.

In exemplary embodiments of the present inventive concept, the plasma generator 180 may generate plasma from the process gas of the first space 111. The plasma generator 180 may generate an inductively coupled plasma, a capacitively coupled plasma, or a microwave plasma.

In the case where the plasma generator 180 is configured to generate an inductively coupled plasma, the plasma generator 180 may include a high frequency power source 181 an impedance matcher 182, and a high frequency antenna 183. For example a ceiling of the process chamber 110 may be provided with a dielectric window 184 spaced from the reflector 140. An antenna chamber 185 may be installed integrally with the process chamber 110 to receive a high frequency antenna 183 having a coil shape such as a spiral or a concentric circle on the dielectric window 184. The high frequency antenna 183 may be electrically connected to the high frequency power source 181 through the impedance matcher 182. The high frequency power source 181 may output a high frequency power suitable for plasma generation. The impedance matcher 182 may be provided for matching the impedance of the high frequency power source 181 with a load, for example, the impedance of the high frequency antenna 183.

As the process gas supplied from the gas supplier 150 is injected into the first space 111 through the gas injector 170, the process gas, such as a deposition source gas and a plasma generation source gas, may be uniformly diffused in the first space 111. A magnetic field may be generated around the high frequency antenna 183 due to a current flowing in the high frequency antenna 183, and magnetic force lines may penetrate the dielectric window 184 and pass through the first space 111. An induced electric field may be generated by a temporal change of the magnetic field, and electrons accelerated by the induced electric field may collide with molecules or atoms of a deposition source gas to thereby generate plasma. The plasma generated in the first space 111 may be diffused into the second space 112 through the second through hole 141 of the reflector 140 and the first through hole 131 of the insulating plate 130. The plasma supplied to the second space 112 may react with the substrate 101 or a material film that is disposed on the substrate 101 to thereby grow a desired material film on the substrate 101.

Figure 3:
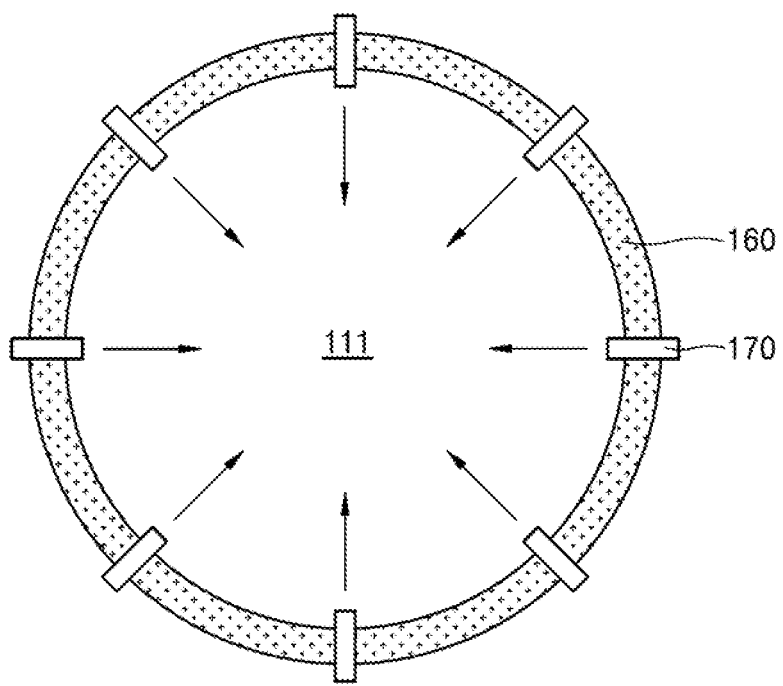
FIG. 3 is a plan view illustrating a radiator and a gas injector in the semiconductor manufacturing apparatus shown in FIG. 1.
Figure 4:
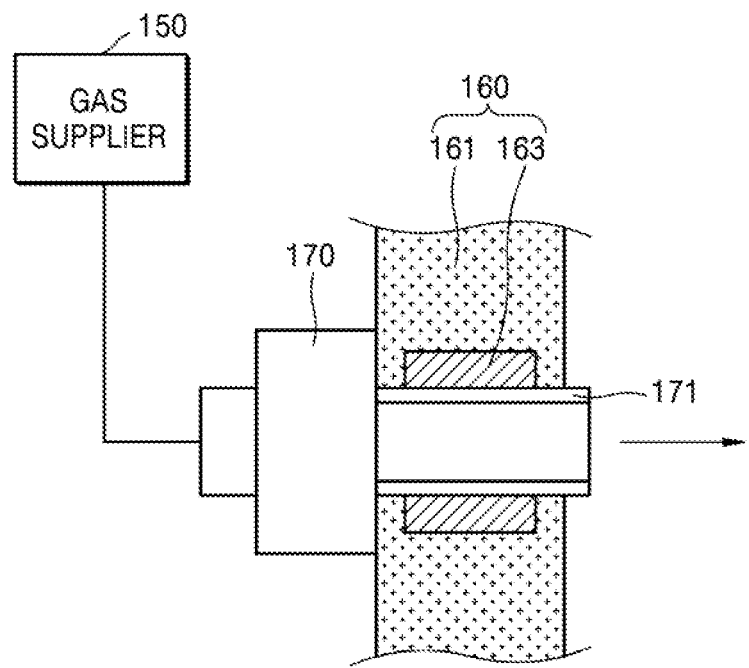
FIG. 4 is a cross-sectional view illustrating the radiator and the gas injector shown FIG. 1.

FIG. 3 is a plan view illustrating the radiator 160 and the gas injector 170 in the semiconductor manufacturing apparatus 100 shown in FIG. 1. FIG. 4 is a cross-sectional view illustrating the radiator 160 and the gas injector 170 shown in FIG. 1.

Referring to FIGS. 3 and 4 together with FIG. 1, the radiator 160 may extend in a circumferential direction of the process chamber 110. The radiator 160 may include a heat generating body 161 extending in the circumferential direction of the process chamber 110 and a heating element 163 installed in the heat generating body 161.

In exemplary embodiments of the present inventive concept, the heating element 163 may include a lamp, an ultraviolet (UV) light source, a light-emitting diode (LED) light source, a laser light source, or a hot wire.

A plurality of gas injector 170 may be installed on the radiator 160 and be spaced apart from each other in the circumferential direction of the radiator 160. For example, as shown in FIG. 3, eight gas injectors 170 may be installed. The eight gas injectors 170 may be radially spaced apart from each other. A process gas injected from the gas injectors 170 may be injected toward the center of the process chamber 110.

As shown in FIG. 4, each of the gas injectors 170 may extend through the radiator 160 and may include a flow path 171 for guiding the process gas. The flow path 171 may guide the process gas such that the process gas supplied through the gas supplier 150 is supplied to the first space 111 via the radiator 160. In this case, the radiator 160 may heat the process gas flowing along the flow path 171 of the gas injector 170, and thus, a high-temperature process gas may be injected into the first space 111. In the flow path 171, the process gas may be swirled and uniformly dispersed and then be supplied to the first space 111. If necessary, a gas filter for filtering impurities and the like may be installed in the flow path 171.

Figure 5:
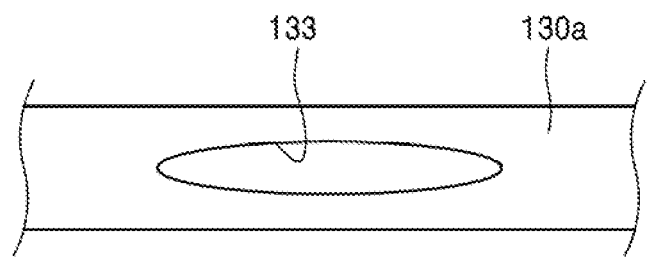
FIG. 5 is a cross-sectional view illustrating an insulating plate according to exemplary embodiments of the present inventive concept.

FIG. 5 is a cross-sectional view illustrating an insulating plate 130*a* according to exemplary embodiments of the present inventive concept.

Referring to FIG. 5, the insulating plate 130*a* may include an air pocket 133. The air pocket 133 may be a cavity formed inside the insulating plate 130*a*. In exemplary embodiments of the present inventive concept, the air pocket 133 may be filled with a gas such as air. The air pocket 133 may lower the thermal conductivity of the insulating plate 130*a*. Since the thermal conductivity of the insulating plate 130*a* may be lowered by the air pocket 133, heat transfer between the first space 111 and the second space 112 may be reduced.

Figure 6:
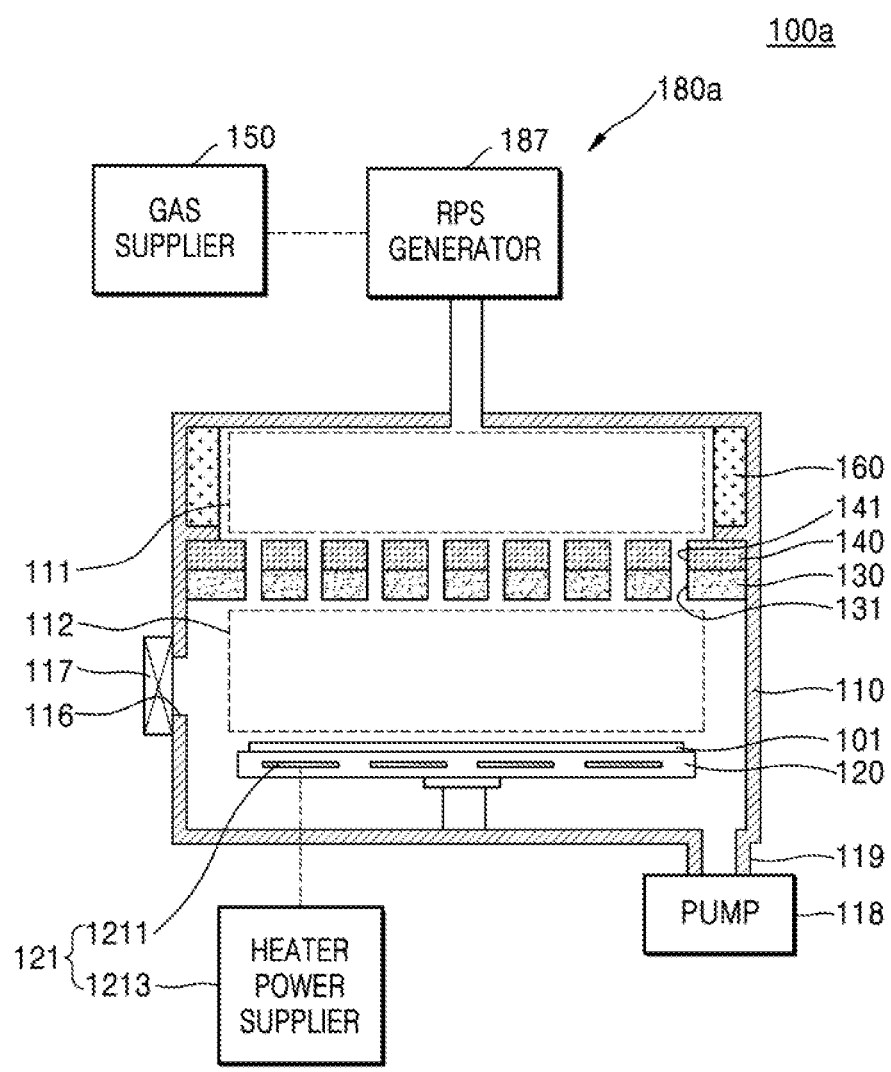
FIG. 6 is a cross-sectional view of a semiconductor manufacturing apparatus according to exemplary embodiments of the present inventive concept.

FIG. 6 is a cross-sectional view of a semiconductor manufacturing apparatus 100*a* according to exemplary embodiments of the present inventive concept. The semiconductor manufacturing apparatus 100*a* shown in FIG. 6 may have substantially the same configuration as the semiconductor manufacturing apparatus 100 shown in FIG. 1, except for the configuration of a plasma generator 180*a*. Thus, descriptions overlapping with those described with reference to FIG. 1 are omitted or simplified and to the extent that a description of various elements have been omitted, it may be assumed that the omitted details are at least similar to the details of corresponding elements that have already been described.

Referring to FIG. 6, the plasma generator 180*a* may include a remote plasma generator 187 disposed outside of the process chamber 110. The remote plasma generator 187 may be configured to supply a remote plasma source (RPS) generated in a remote plasma method to the process chamber 110. The remote plasma generator 187 may generate plasma from a process gas supplied from a gas supplier 150 and may supply generated plasma to a first space 111 of the process chamber 110.

Figure 7:
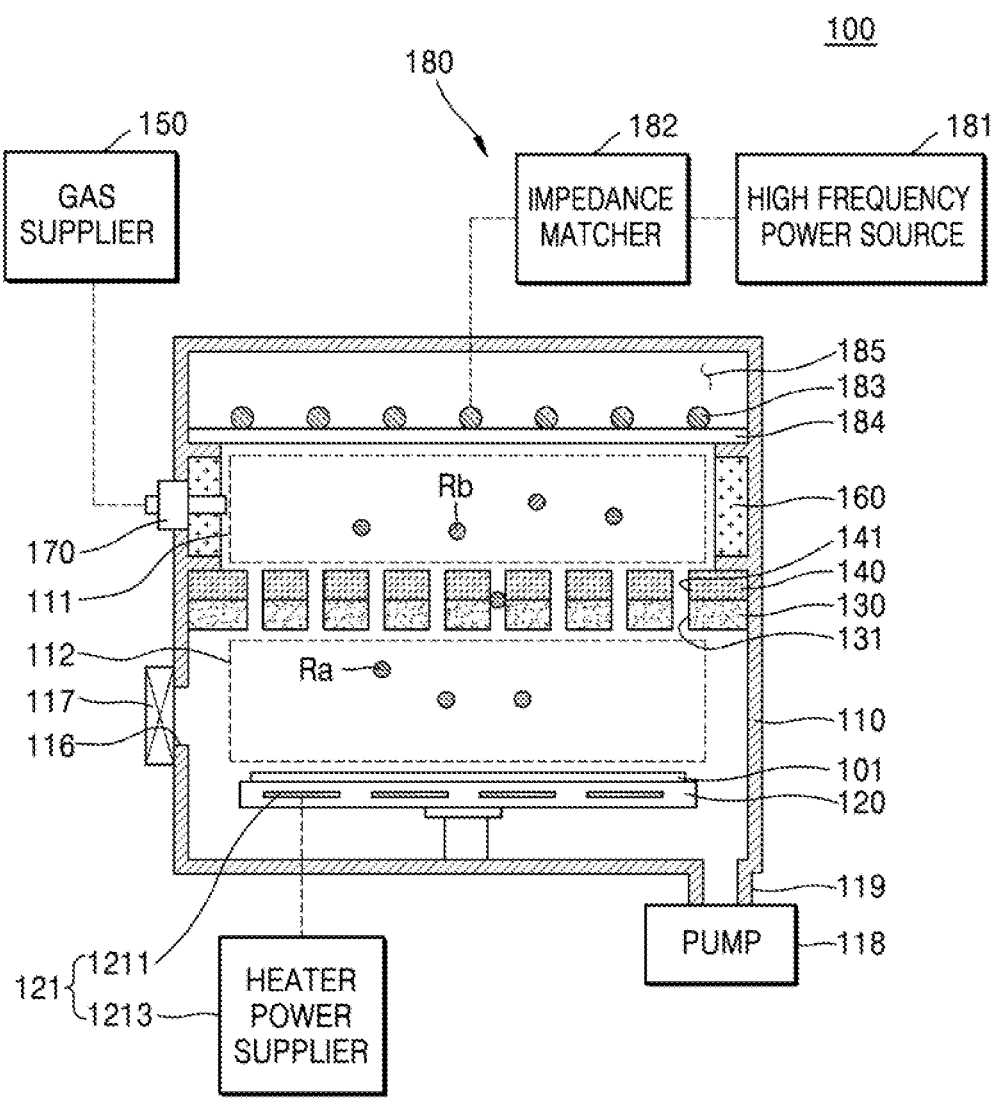
FIG. 7 is a cross-sectional view illustrating a method of manufacturing graphene by using a semiconductor manufacturing apparatus according to exemplary embodiments of the present inventive concept.

FIG. 7 is a cross-sectional view illustrating a method of manufacturing graphene by using a semiconductor manufacturing apparatus 100 according to exemplary embodiments of the present inventive concept.

Referring to FIG. 7, a vas supplier 150 may supply an inert gas for plasma generation and a carbon-containing gas, which is a gas source for deposition, into a first space 111. For example, the carbon-containing gas may include ethylene ($C_2H_4$), methane ($CH_4$), ethane ($C_2H_6$), propane ($C_3H_8$), propylene ($C_3H_6$), acetylene ($C_2H_2$), methanol ($CH_3OH$), ethanol ($C_2H_5OH$), or the like.

The plasma generator 180 may generate an electric field in the first space 111 to thereby generate plasma. For example, carbon radicals activated in a state in which a chemical reaction may be spontaneously caused may be generated while electrons generated by, the electric field generated in the first space 111 collide with the carbon-containing gas. The carbon radicals may be diffused into a second space 112 through a second through hole 141 of a reflector 140 and a first through hole 131 of an insulating plate 130 and may be transported to the surface of a substrate 101 by convection or diffusion in the second space 112. The carbon radicals transported to the surface of the substrate 101 may be physically adsorbed to the substrate 101 or a material film on the substrate 101, or may form a chemical bond with atoms of the substrate 101 or the material film on the substrate 101. In this case, carbon radicals Ra having high activation energy may move to an optimal position found through surface migration on the substrate 101 or the material film on the substrate 101. The carbon radicals Ra may form a stable network, for example, a hexagonal honeycomb mixture. On the other hand, carbon radicals Rb having low activation energy may disappear before reaching the substrate 101 or disappear without participating in reaction on the substrate 101 or the material film on the substrate 101.

While carbon radicals are generated in the first space 111, the first space 111 may maintain a first temperature that is relatively high. For example, the first temperature of the first space 111 may be about 700° C. to about 1200° C. The radiator 160 may heat the first space 111 or heat a process gas flowing into the first space 111 through the gas injector 170 to maintain the first space 111 at the first temperature. In the condition of the first temperature that is a high temperature, the production ratio of the carbon radicals Ra having high activation energy may increase.

As described above, the first space 111 and the second space 112 in the process chamber 110 may be thermally isolated from each other by the insulating plate 130 and the reflector 140. Therefore, the temperature of the first space 111, which is a region where plasma is generated, may be maintained at a relatively high temperature, and the temperature of the second space 112, which is a region where graphene is grown, may be maintained at a relatively low temperature. For example, the temperature of the first space 111 may be maintained at a high temperature, for example, a temperature between about 700° C. and about 1200° C., so that the carbon radicals Ra having high activation energy are generated. A stage 120 may adjust the temperature of the substrate 101 at a relatively low temperature, for example, about 100° C. to about 600° C., to prevent deterioration of the substrate 101 or the material film on the substrate 101.

Generally, when graphene is grown at a low growth temperature (for example, at a temperature of about 600° C. or less), crystallinity of the graphene is degraded. However, according to exemplary embodiments of the present inventive concept, since it is possible to grow graphene on the substrate 101 by using the carbon radicals Ra having high activation energy under a high temperature condition, graphene having high crystallinity may be manufactured even at a low growth temperature.

Figure 8:
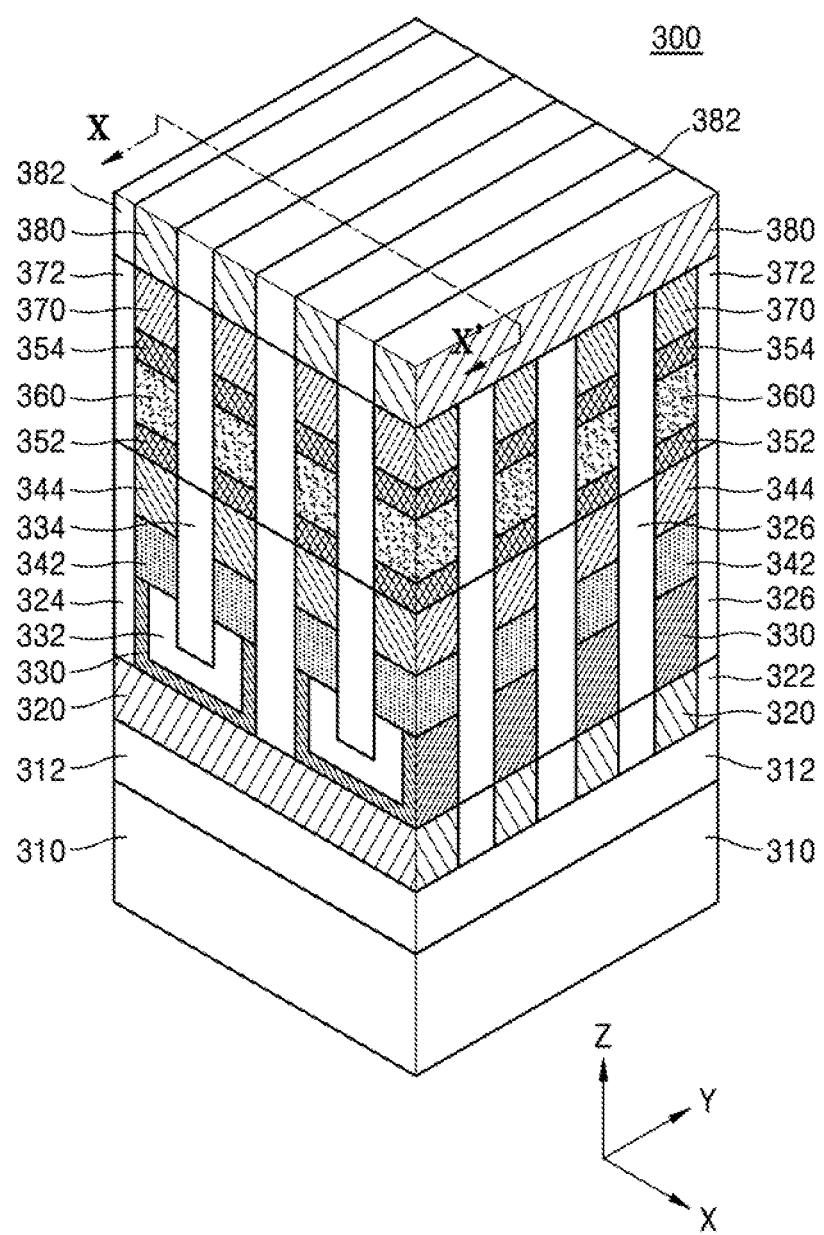
FIG. 8 is a perspective view illustrating a memory device according to exemplary embodiments of the present inventive concept.
Figure 9:
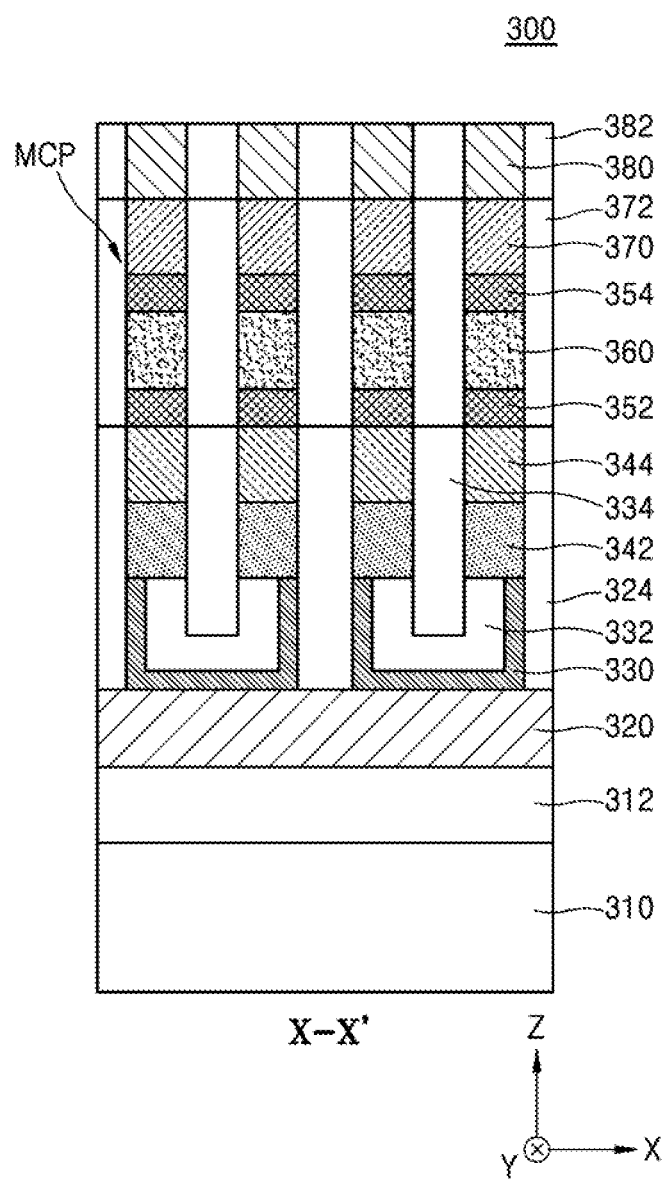
FIG. 9 is a cross-sectional view illustrating the memory device, taken along a line X-X' in FIG. 8.

FIG. 8 is a perspective view of a memory device 300 according to exemplary embodiments of the present inventive concept. FIG. 9 is a cross-sectional view of the memory device 300, taken along a line X-X' in FIG. 8.

Referring to FIGS. 8 and 9, the memory device 300 may include a plurality of first conductive lines 320, a plurality of second conductive lines 380, and a plurality of memory cells MCP, located above a substrate 310.

A first interlayer insulating film 312 may be located on a substrate 310. The first interlayer insulating film 312 may include an oxide such as silicon oxide or a nitride such as silicon nitride. A plurality of transistors may be formed on the substrate 310 to constitute a driving circuit for driving a plurality of memory cells MCP. For example, the driving circuit may be one or more peripheral circuits configured to process data input/output to/from the plurality of memory cells MCP. For example, the peripheral circuits may include a page buffer, a latch circuit, a cache circuit, a column decoder, a sense amplifier, a data in/out circuit, and/or a row decoder. For example, the driving circuit may be located on the substrate 310 in a region vertically overlapping the plurality of memory cells MCP, and the first interlayer insulating film 312 may at least partially cover the driving circuit on the substrate 310. Alternatively, the driving circuit may be located on a region of the substrate 310 which does not vertically overlap the plurality of memory cells MCP.

The plurality of first conductive lines 320 may extend in a first direction (X direction) on the first interlayer insulating film 312. The plurality of second conductive lines 380 may extend in a second direction (Y direction) at a higher level than that of the plurality of first conductive lines 320 with respect to the upper surface of the substrate 310. The plurality of first conductive lines 320 may be word lines and the plurality of second conductive lines 380 may be bit lines.

The plurality of first conductive lines 320 and the plurality of second conductive lines 380 may each include a metal, a conductive metal nitride, a conductive metal oxide, or a combination thereof. For example, the plurality of first conductive lines 320 and the plurality of second conductive lines 380 may each include graphene, W, WN, Au, Ag, Cu, Al, TiAlN, Ir, Pt, Pd, Ru, Zr, Rh, Ni, Co, Cr, Sn, Zn, ITO, an alloy thereof, or a combination thereof. The plurality of first conductive lines 320 and the plurality of second conductive lines 380 may each include a metal film and a conductive barrier film covering at least a part of the metal film. The conductive barrier film may include, for example, Ti, TiN, Ta, TaN, or a combination thereof.

A first insulating layer 322 may be located between each of the plurality of first conductive lines 320 and a second insulating layer 382 may be located between each of the plurality of second conductive lines 380. The first insulating layer 322 may have a plurality of line shapes each extending in the first direction (the X direction). The second insulating layer 382 may have a plurality of line shapes each extending in the second direction (the Y direction).

The plurality of memory cells MCP may be arranged between the plurality of first conductive lines 320 and each of the plurality of second conductive lines 380. Each of the plurality of memory cells MCP may be located in a region where the plurality of first conductive lines 320 overlap the plurality of second conductive lines 380 in a vertical direction, and may be connected to a first conductive line 320 and a second conductive line 380, which correspond to the memory cell MCP.

Each of the plurality of memory cells MCP may include a heating electrode 330, a variable resistance memory layer 342, an intermediate electrode 344, a first interface layer 352, switch material pattern 360, a second interface layer 354, and an upper electrode 370, that are sequentially arranged on the plurality of first conductive lines 320.

A first insulating pattern 324 may be located between two memory cells MCP adjacent to each other in the first direction (X direction) on the plurality of first conductive lines 320. The second insulating pattern 326 may be located between two memory cells MCP adjacent to each other in the second direction (Y direction) on the first insulating pattern 322. The second insulating pattern 326 may have a plurality of line shapes extending in the second direction (Y direction). The first insulating pattern 324 and the second insulating pattern 326 may have upper surfaces located on the same level as the upper surface of the intermediate electrode 344. Alternatively, the first insulating pattern 324 and the second insulating pattern 326 may include a single material layer.

The heating electrode 330 may include a conductive material configured to gen rate heat sufficient to phase-change the variable resistance memory layer 342. In exemplary embodiments of the present inventive concept, the heating electrode 330 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof. The heating electrode 330 may have a U-shaped cross section, and one heating electrode 330 may be shared by two neighboring memory cells MCPs. However, the shape and arrangement of the heating electrode 330 are not limited thereto.

In exemplary embodiments of the present inventive concept, the heating electrode 330 may include graphene. In this case, since the heating electrode 330 including graphene has high electrical conductivity, the heating electrode 330 may suppress a leakage of a current that is transmitted from the heating electrode 330 to, the variable resistance memory layer 342. In addition, since the heating electrode 330 include graphene has high thermal conductivity, heat generated in the heating electrode 330 may be efficiently transferred to the variable resistance memory layer 342.

A third insulating pattern 332 having a U-shaped cross section may be located on the inner wall of the heating electrode 330. Also, a fourth insulating pattern 334 may be located on the third insulating pattern 332 between two memory cells MCP sharing one heating electrode 330. The fourth insulating pattern 334 may have an upper surface located in a same plane as the upper surface of the intermediate electrode 344.

The variable resistance memory layer 342 may be located on the beating electrode 330 and the third insulating pattern 332. The variable resistance memory layer 342 may include a phase change material that is configured to change from an amorphous state to a crystalline state, and from the crystalline state to the amorphous state, depending on a heating time. For example, the phase of the variable resistance memory layer 342 may be reversibly changed by Joule heat generated by a voltage applied across the variable resistance memory layer 342, and the variable resistance memory layer 342 may include a material of which an electrical resistance may be changed by the phase change. For example, the phase change material may have a relatively high electrical resistance in the amorphous state and have a relatively low electrical resistance in the crystalline state. By defining the high electrical resistance state to "0" and the low electrical resistance state to "1", for example, data may be stored in the variable resistance memory layer 342.

In some exemplary embodiments of the present inventive concept, the variable resistance memory layer 342 may include Ge—Sb—Te, Ge—Te, Sb—Te, In—Se, Ga—Sb, In—Sb, As—Te, Al—Te, Bi—Sb—Te(BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, In—Sn—Sb—Te, and As—Ge—Sb—Te, or a combination thereof.

In some exemplary embodiments of the present inventive concept, the variable resistance memory layer 342 may further include impurities such as carbon (C), nitrogen (N), silicon (Si), oxygen (O), bismuth (Bi), and/or tin (Sn). In some exemplary embodiments of the present inventive concept, the variable resistance memory layer 342 may further include metal materials such as Al, Ga, Zn, Ti, Cr, Mn, Fe, Co, Ni, Mo, Ru, Pd, Hf, Ta, Ir, Pt, Zr, Pb, and/or Po.

In some exemplary embodiments of the present inventive concept, the variable resistance memory layer 342 may have a multilayer structure in which two or more layers having different physical properties are stacked, and a barrier layer may be further formed between a plurality of layers, for, example, the two or more layers, to prevent diffusion of material between the plurality of layers. A barrier layer may be further formed. In addition, the variable resistance memory layer 342 may have a super-lattice structure in which a plurality of layers including different materials are alternately stacked. For example, the variable resistance memory layer 342 may have a structure in which a first layer of Ge—Te and a second layer of Sb—Te are alternately, and perhaps repeatedly, stacked. However, the materials of the first layer and the second layer are not limited to Ge—Te and Sb—Te and may include various materials described above.

The intermediate electrode 344 may be located on the variable resistance memory layer 342. In exemplary embodiments of the present inventive concept, the intermediate electrode 344 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof.

The first interface layer 352, the switch material pattern 360, and the second interface layer 354 may be sequentially formed on the intermediate electrode 344. The first interface layer 352 may include a material layer that prevents the switch material pattern 360 from being damaged by contact between the switch material pattern 360 and the intermediate electrode 344. The second interface layer 354 may include a material layer that prevents the switch material pattern 360 from being damaged by contact between the switch material pattern 360 and the upper electrode 370.

In exemplary embodiments of the present inventive concept, the first interface layer 352 and/or the second interface layer 354 may include graphene. Since the first interface layer 352 and/or the second interface layer 354 includes graphene, the switch material pattern 360 may be stably supported by the graphene having high rigidity, and furthermore, a leakage of a current that is transferred to the switch material pattern 360 may be suppressed.

The switch material pattern 360 may be located on the first interface layer 352. The switch material pattern 360 may be a current control layer configured to control the flow of current. The switch material pattern 360 may include a material layer of which an electrical resistance may vary depending on the magnitude of a voltage across the switch material pattern 360. For example, the switch material pattern 360 may include a material layer having an Ovonic Threshold Switching (OTS) characteristic. The switch material pattern 360 may include a chalcogenide material as an OTS material layer. In exemplary embodiments of the present inventive concept, the switch material pattern 360 may include silicon (Si), tellurium (Te), selenium (Se), sulfur (S), arsenic (As), germanium (Ge), indium (In), antimony (Sb), or a combination of these elements. For example, the switch material pattern 360 may include a chalcogenide material having a chemical formula $Ge_XAs_YSe_XSi_U(0<X+Y+Z+U\le1)$. The upper electrode 370 may be located on the second interface layer 354. The upper electrode 370 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiON, TiAlON, WON. TaON, C, SiC, SiCN, CNN, TiCN, TaCN, or a combination thereof.

A buried insulating layer 372 may surround the side walls of the first interface layer 352, the switch material pattern 360, the second interface layer 354, and the upper electrode 370. The bottom surface of the buried insulating layer 372 may contact the upper surfaces of the first, second and fourth insulating patterns 324, 326 and 334, and the upper surface of the buried insulating layer 372 may be located on the same plane as the upper surface of the upper electrode 370. The side walls of the first interface layer 352, the switch material pattern 360, the second interface layer 354, and the upper electrode 370 may be aligned to each other and arranged in a straight line.

The plurality of second conductive lines 380 may be arranged on the upper electrode 370 and the buried insulating layer 372.

FIGS. 10A to 10I are cross-sectional views illustrating a method of manufacturing the memory device 300 shown in FIGS. 8 and 9.

Figure 10A:
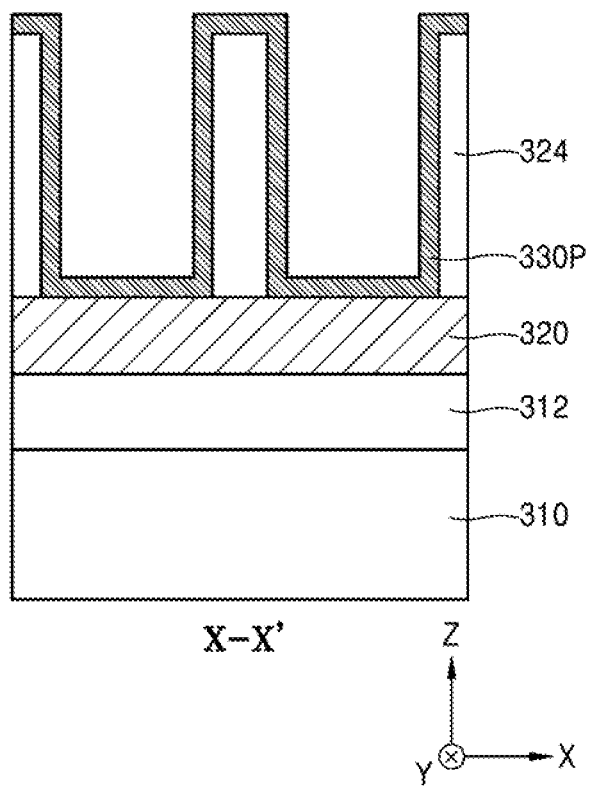
FIGS. 10A to 10I are cross-sectional views illustrating a method of manufacturing the memory device shown in FIGS. 8 and 9.

Referring to FIG. 10A, a first interlayer insulating film 312 may be formed on, a substrate 310. A plurality of first conductive lines 320 may be formed by forming a conductive layer on the first interlayer insulating film 312 and then patterning the conductive layer. In some exemplary embodiments of the present inventive concept, to form a conductive layer for the plurality of first conductive lines 320, a graphene film may be directly grown on the first interlayer insulating film 312 by using the semiconductor manufacturing apparatus 100 or 100a described with reference to FIGS. 1 to 7.

Then, an insulating layer may be formed on the plurality of first conductive lines 320 and the first interlayer insulating film 312, and an upper portion of the insulating layer may be planarized until the upper surfaces of the plurality of first conductive lines 320 are exposed, to thereby form the first insulating layer 322 shown in FIG. 8. In this case, a planarization process for the upper portion of the insulating layer may be a chemical mechanical planarization (CMP) process using the plurality of first conductive lines 320 as a polishing stop layer.

A first insulating pattern 324 may then be formed on the plurality of first conductive lines 320 and the first insulating layer 322. The first insulating pattern 324 may have a plurality of line pattern shapes each extending in the second direction (Y direction).

A heating electrode layer 330P may be conformally formed on the upper surfaces of the plurality of first conductive lines 320, the upper surface of the first insulating layer 322, and the side wall and upper surface of the first insulating pattern 324. In some exemplary embodiments of the present inventive concept, to form the heating electrode layer 330P, a graphene film may be directly gown on the upper surfaces of the plurality of first conductive lines 320, the upper surface of the first insulating layer 322, and the side wall and upper surface of the first insulating pattern 324 by using the semiconductor manufacturing apparatus 100 or 100a described with reference to FIGS. 1 to 7.

Figure 10B:
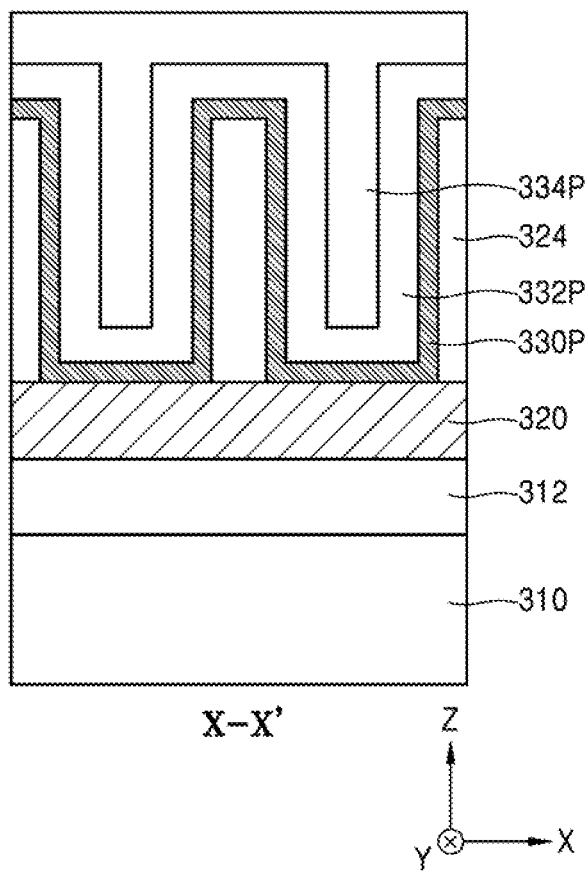

Referring to FIG. 10B, a spacer insulating layer 332P and a buried insulating layer 334P may be sequentially formed on the heating electrode layer 330P.

Figure 10C:
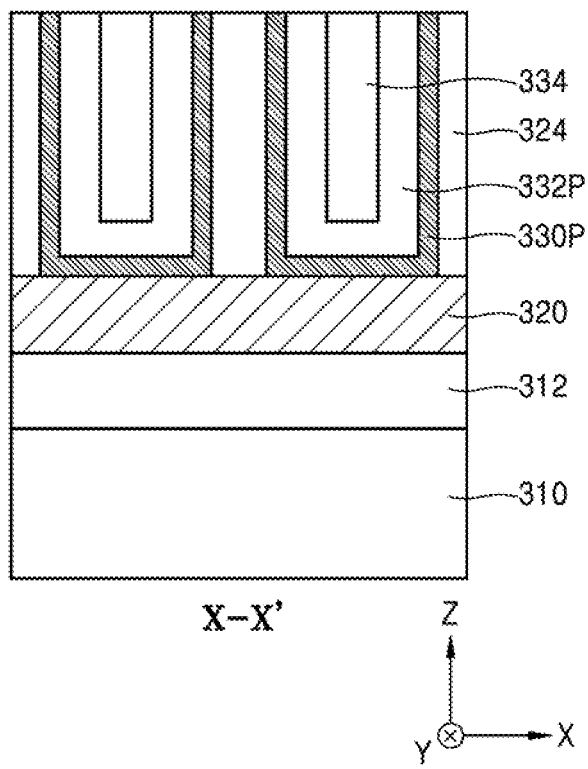

Referring to FIG. 10C, upper portions of the heating electrode layer 330P, the spacer insulating layer 332P, and the buried insulating layer 334P may be removed to expose the upper surface of the first insulating pattern 324. A process for removing the upper portions of the heating electrode layer 330P, the spacer insulating layer 332P, and the buried insulating layer 334P may be a CMP process or an etch-back process.

Then, a mask pattern may be formed on the first insulating pattern 324, the heating electrode layer 330P, the spacer insulating layer 332P, and the buried insulating layer 334P, and portions of the first insulating pattern 324, the heating electrode layer 330P, the spacer insulating layer 332P, and the buried insulating layer 334P may be removed by using the mask pattern as an etching mask. The mask pattern may have a plurality of line shapes extending in the first direction (X direction) and may be arranged to vertically overlap the plurality of first conductive lines 320. Accordingly, the portions of the first insulating pattern 324, the heating electrode layer 330P, the spacer insulating layer 332P, and the buried insulating layer 334P may be removed and the upper surface of the first insulating layer 322 may be exposed again.

Then, a region where the portions of the first insulating pattern 324, the heating electrode layer 330P, the spacer insulating layer 332P, and the buried insulating layer 334P are removed may be filled with an insulating material to thereby form the second insulating pattern 326 in FIG. 8. A portion of the buried insulating layer 334P remaining at this time may be referred to as a fourth insulating pattern 334.

Figure 10D:
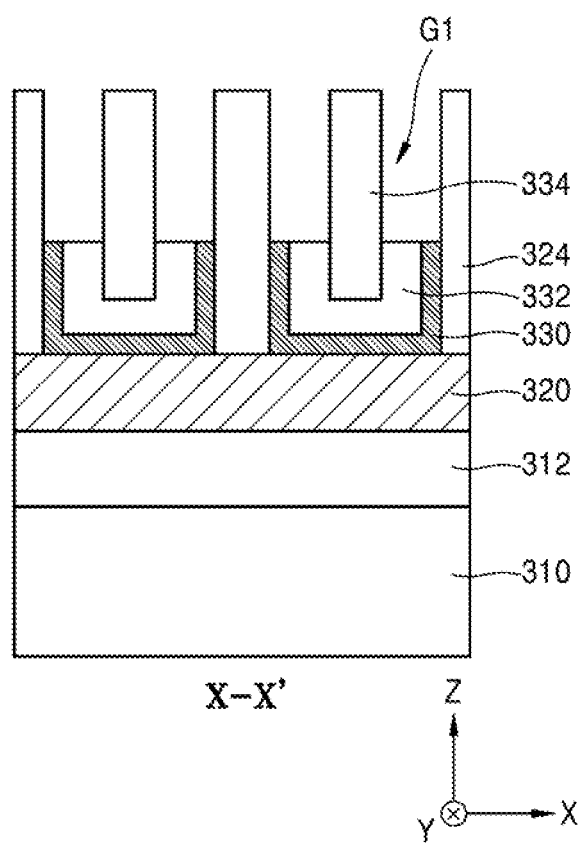

Referring to FIG. 10D, upper portions of the heating electrode layer 330P in FIG. 10C and the spacer insulating layer 332P in FIG. 10C may be removed by an etch-back, process and thus a heating electrode 330 and a third insulating pattern 332 may be formed. The upper surface of the heating electrode 330 may be located at the same level as the upper surface of the third insulating pattern 332 and may be arranged at a lower level than the upper surface of the first insulating pattern 324. A first gap G1 may be defined, by an etch back process, in a space between the first insulating pattern 324 and the fourth insulating pattern 334 on the heating electrode 330 and the third insulating pattern 332.

Figure 10E:
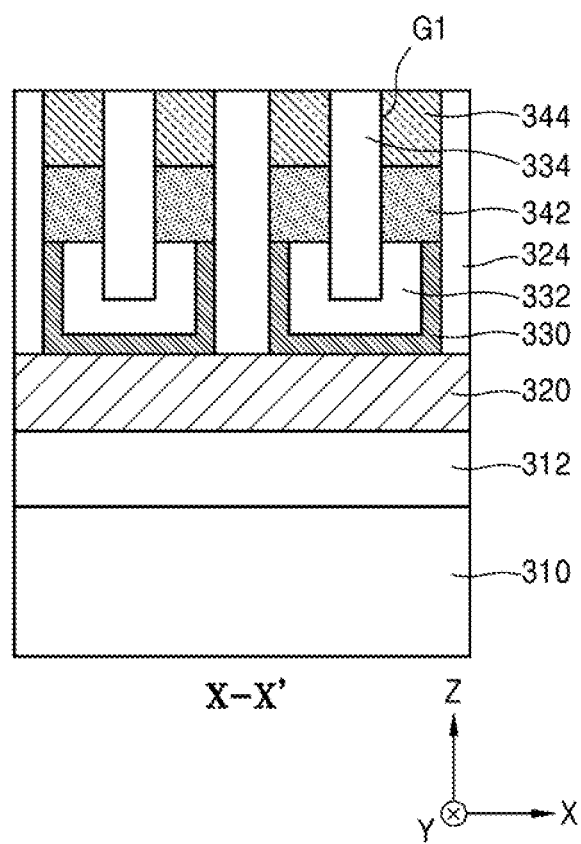

Referring to FIG. 10E, a variable resistance memory layer 342 and an intermediate electrode 344 filling the inside of the first gap G1 may be sequentially formed on the heating electrode 330 and the third insulating pattern 332.

Figure 10F:
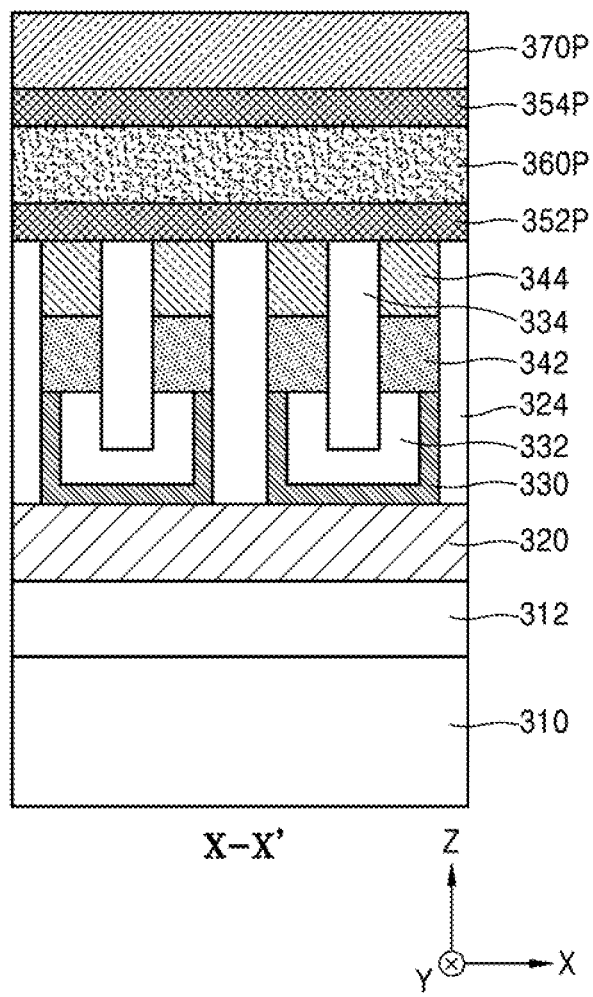

Referring to FIG. 10F, a preliminary first interface layer 352P, a preliminary switch material layer 360P, a preliminary second interface layer 354P, and a preliminary upper electrode layer 370P may be sequentially formed on the intermediate electrode 344 and the first, second, and fourth insulating patterns 324, 326, and 334 in FIG. 8.

In some exemplary embodiments of the present inventive concept, the preliminary first interface layer 352P and the preliminary second interface layer 354P may include a graphene film grown using the semiconductor manufacturing apparatus 100 or 100a described with reference to FIGS. 1 to 7. For example, to form the preliminary first interface layer 352P, a graphene film may be directly grown on the intermediate electrode 344 and the first, second, and fourth insulating patterns 324, 326, and 334 in FIG. 8. Furthermore, to form the preliminary second interface layer 354P, a graphene film may be directly grown on the preliminary switch material layer 360P.

Figure 10G:
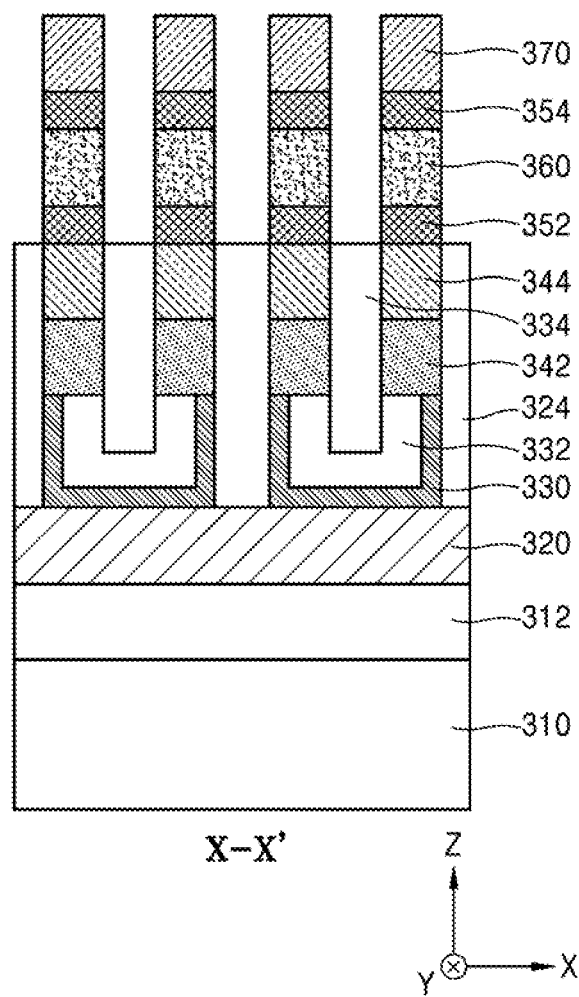

Referring to FIG. 10G, a mask pattern may be formed on the preliminary upper electrode layer 370P, and the preliminary first interface layer 352P, the preliminary switch material layer 360P, the preliminary second interface layer 354P, and the preliminary upper electrode layer 370P may be patterned using the mask pattern to thereby form a first interface layer 352, a switch material pattern 360, a second interface layer 354, and an upper electrode 370, which are sequentially arranged on the intermediate electrode 344.

In exemplary embodiments of the present inventive concept, the mask pattern may have a plurality of island shapes spaced apart in a first direction (a X direction) and a second direction (an Y direction). When seen in a plane view, the first interface layer 352, the switch material pattern 360, the second interface layer 354, and the upper electrode 370, which are patterned using the mask pattern as an etch mask and which have the plurality of island shapes, may have a plurality of island shapes spaced apart in the first direction (the X direction) and in the second direction (the Y direction).

Figure 10H:
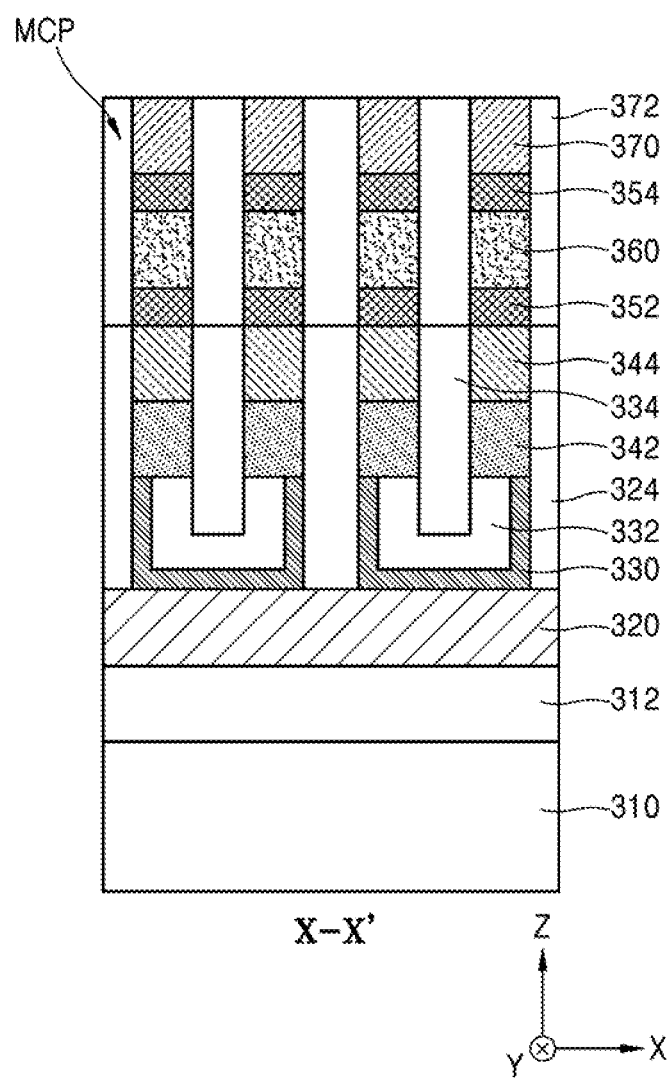

Referring to FIG. 10H, a buried insulating layer 372 may be formed by filling an insulating material into a space between a plurality of memory cells MCP and removing an upper portion of the insulating material to expose the upper surface of the upper electrode 370.

Figure 10I:
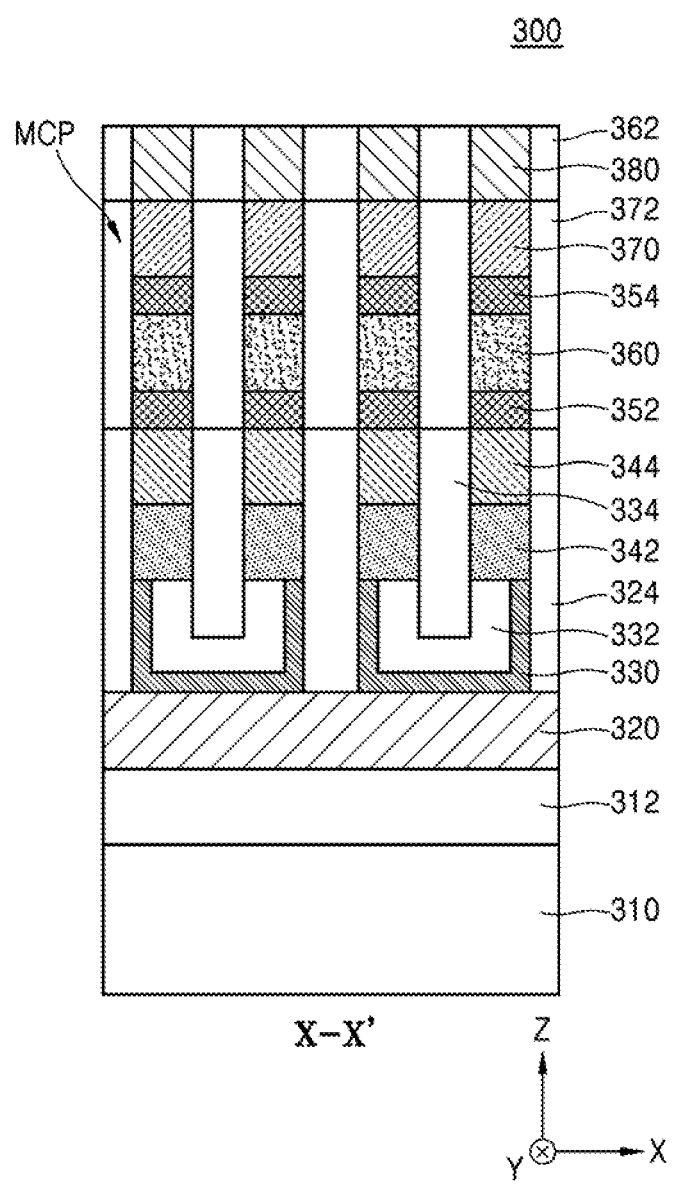

Referring to FIG. 10I, a plurality of second conductive lines 380 may be formed by forming a conductive layer on the upper electrode 370 and the buried insulating layer 372 and patterning the conductive layer. In some exemplary embodiments of the present inventive concept, to form the conductive layer of the plurality of second conductive lines 380, a graphene film may be directly grown on the upper electrode 370 and the buried insulating layer 372 by using the semiconductor manufacturing apparatus 100 or 100a described with reference to FIGS. 1 to 7.

Then, an insulating layer may be formed on the plurality of second conductive lines 380 and the buried insulating layer 372, and an upper portion of the insulating layer may be planarized until, the upper surfaces of the plurality of first conductive lines 320 are exposed, to thereby form a second insulating layer 382. In this case, a planarization process for the upper portion of the insulating layer may be a CMP process using the plurality of second conductive lines 380 as a polishing stop layer.

Figure 11A:
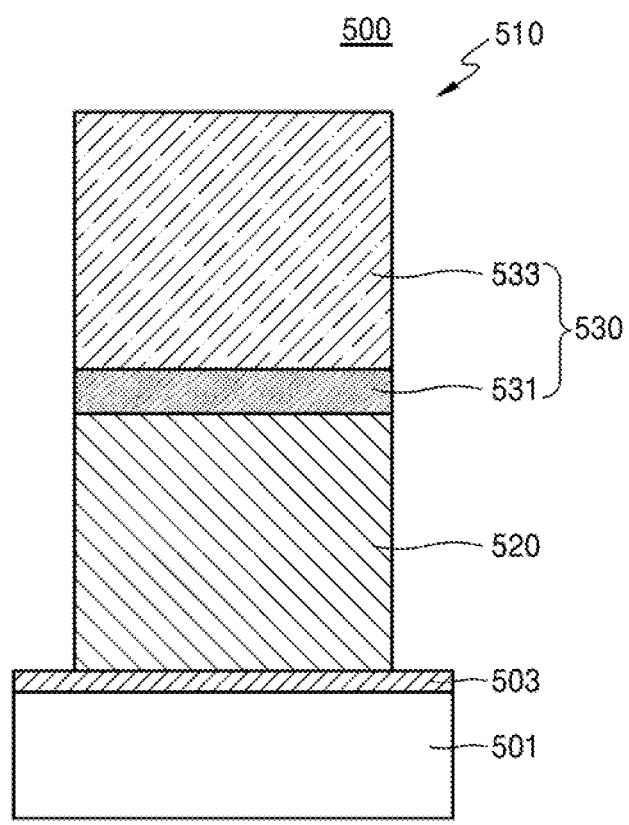
FIGS. 11A and 11B are cross-sectional views illustrating main configurations of semiconductor devices, respectively, according to exemplary embodiments of the present inventive concept.
Figure 11B:
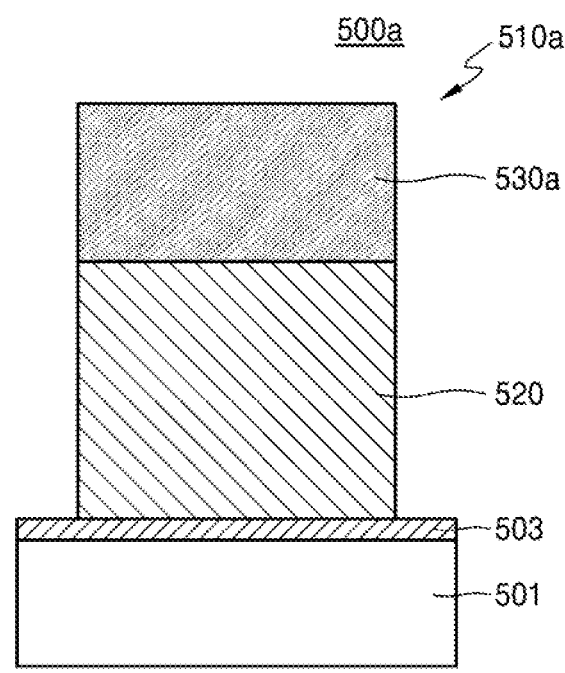

FIGS. 11A and 11B are cross-sectional views illustrating main configurations of semiconductor devices 500 and 500a, respectively, according to exemplary embodiments of the present inventive concept.

Referring to FIG. 11A, the semiconductor device 500 may include a wiring structure 510 including a polysilicon layer 520 and a conductive material layer 530, sequentially formed on a substrate 501. For example, the wiring structure 510 may form a bit line structure such as a gate bit line.

The substrate 501 may be a substrate for manufacturing the semiconductor device 500 to which the wiring structure 510 is applied and may include a semiconductor such as Si or Ge or a compound semiconductor such as SiGe, SiC, GaAs, InAs, or InP. An insulating film 503, for example, a silicon oxide layer may be formed on the substrate 501.

The conductive material layer 530 may be provided on the polysilicon layer 520 and may have a structure in which a first conductive material layer 531 and a second conductive material layer 533 are stacked. Although FIG. 11A illustrates a case where the conductive material layer 530 has a two-layered structure including the first conductive material layer 531 and the second conductive material layer 533, the inventive concept is not limited thereto. For example, the conductive material layer 530 may have a stacked structure of three or more layers.

In exemplary embodiments of the present inventive concept, the first conductive material layer 531 may include graphene. The first conductive material layer 531 may function, for example, as a diffusion barrier. Furthermore, in exemplary embodiments of the present inventive concept, the second conductive material layer 533 may include tungsten (W) or tungsten silicide (WSix).

Generally, a diffusion barrier film in a wiring structure may include Ti—Si—N (TSN) or titanium nitride (TiN). However, according to exemplary embodiments of the present inventive concept, by forming a first conductive material layer 531, which may function as a diffusion barrier, by using graphene having a very low resistivity, an electrical resistance increases and a leakage current of the wiring structure 510 may be suppressed and a vertical stack down may be achieved.

Referring to FIG. 11B, the semiconductor device 500b may include a wiring structure 510a including a polysilicon layer 520 and a conductive material layer 530, sequentially formed on a substrate 501. The wiring structure 510a shown in FIG. 11B may include a conductive material layer 530a including a single layer. In exemplary embodiments of the present inventive concept, the conductive material layer 530a may include graphene.

The first conductive material layer 531 of FIG. 11A or the conductive material layer 530a of FIG. 11B may include a graphene film formed through a plasma deposition process using the semiconductor manufacturing apparatus 100 or 100a described with reference to FIGS. 1 to 7. For example, a graphene film may be directly grown on the polysilicon layer 520 on the substrate 501 to form the first conductive material layer 531 of FIG. 11A or the conductive material layer 530a of FIG. 11B.

As in FIGS. 11A and 11B, according to exemplary embodiments of the present inventive concept, since the wiring structures 510 and 510a include graphene having excellent electrical conductivity, a wiring electrical resistance may be largely reduced and a vertical stack down may be achieved.

Figure 12:
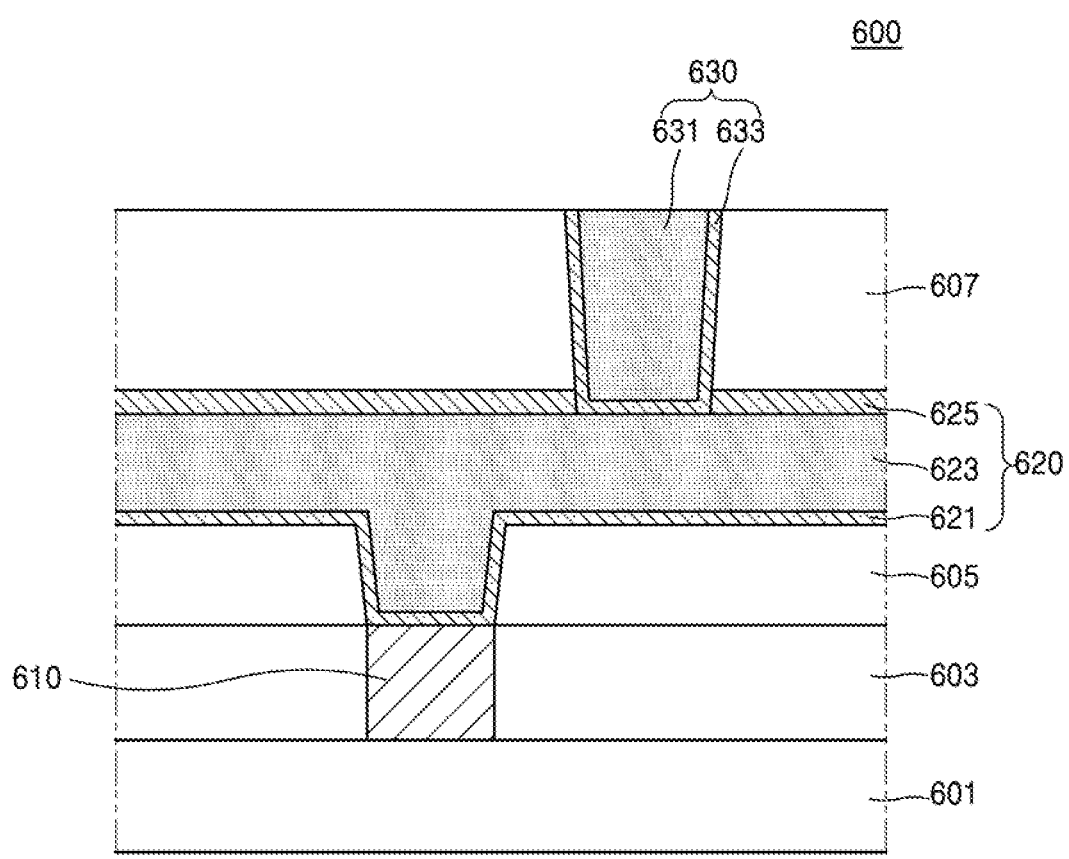
FIG. 12 is a cross-sectional view illustrating a main configuration of a semiconductor device according to exemplary embodiments of the present inventive concept.

FIG. 12 is a cross-sectional view illustrating a main configuration of a semiconductor device 600 according to exemplary embodiments of the present inventive concept.

Referring to FIG. 12, the semiconductor device 600 may include a wiring structure 620 formed on a substrate 601. The wiring structure 620 may include a conductive line portion extending along one direction.

A lower insulating film 603 and a lower conductive film 610 penetrating the lower insulating film 603 may be located on the substrate 601. The lower conductive him 510 may be connected to a conductive region formed on the substrate 601, for example, a source/drain region or a gate electrode of a transistor formed in the substrate 601. A first insulating film 605 may be located on the lower insulating film 603, and the wiring structure 620 may extend to the lower conductive film 610 through the first insulating film 605.

The wiring structure 620 may include a lower capping layer 621, a metal layer 623, and an upper capping layer 525. For example, the wiring structure 620 may include a conductive line portion connected to an upper wiring structure 630 and a contact plug portion protruding from the conductive line portion toward the substrate 601 and connected to the lower conductive film 610.

The lower capping layer 621 may be formed on the first insulating film 605 and may cover the bottom and side walls of the metal layer 623. In exemplary embodiments of the present inventive concept, the lower capping layer 621 may include graphene. Alternatively, in exemplary embodiments of the present inventive concept, the lower capping layer 621 may have a multi-layer structure including a first layer including a graphene film and a second layer interposed between the first layer and the first insulating film 605. The second layer may include Ta, TaN, Ti, TiN, or a combination thereof.

The metal layer 623 may include a conductive material, for example, Cu, W, Co, Ru, Mn, Ti, Ta, or a combination thereof. In exemplary embodiments of the present inventive concept, the metal layer 623 may be formed by forming a seed layer on the lower capping layer 621 and performing a plating process using the seed layer as a seed. In exemplary embodiments of the present inventive concept, the seed layer may include a graphene film, and the metal layer 623 may be formed through a plating process using the graphene film as a seed.

The upper capping layer 625 may cover the upper surface of the metal layer 623. In exemplary embodiments of the present inventive concept, the upper capping layer 625 may include graphene. Alternatively, in other exemplary embodiments of the present inventive concept, the upper capping layer 625 may have a multi-layer structure including a first layer including a graphene film and a second layer interposed between the first layer and a second insulating film 607. The second layer may include Ta, TaN, Ti, TiN, or a combination thereof.

The upper capping layer 625 may be covered with a second insulating film 607. The upper wiring structure 630 may extend through the second insulating film 607 and the upper capping layer 625 so as to be electrically connected to the metal layer 623. The upper wiring structure 630 may be electrically connected to the metal layer 623 through the second insulating film 607 and the upper capping layer 625. The upper wiring structure 630 may include a metal film 631 and a conductive barrier film 633 surrounding the metal film 631. In some exemplary embodiments of the present inventive concept, the upper wiring structure 630 may constitute a contact plug.

The lower capping layer 621 and the upper capping layer 625 may include a graphene film formed through a plasma deposition process using the semiconductor manufacturing apparatus 100 or 100a described with reference to FIGS. 1 to 7. For example, to form the lower capping layer 621, a graphene film may be directly grown on the first insulating film 605. Furthermore, to form the upper capping layer 625, a graphene film may be directly grown on the metal layer 623.

According to exemplary embodiments of the present inventive concept, since the wiring structure 620 includes the lower capping layer 621 and/or the upper capping layer 625, which include graphene having very low electrical resistivity, an electrical resistance increase and a leakage current of the metal layer 623 may be suppressed and the electron movement of a metal from the metal layer 623 may be suppressed to thereby increase the reliability of the wiring structure 620 including the metal layer 623.

While the inventive concept has been particularly shown and, described with reference to exemplary embodiments thereof, it will be understood that various changes in form and details may be made therein without departing from the spirit and scope of the present application.

What is claimed is:

1. A semiconductor manufacturing apparatus, comprising:
   a process chamber;
   an insulating plate dividing an interior space of the process chamber into a first interior space and a second interior space and thermally isolating the first interior space from the second interior space;
   a gas supply configured to supply a process gas to the first interior space;
   a plasma generator configured to generate plasma, in the first interior space, from the process gas;
   a ring-shaped radiator configured to heat the first interior space;
   a stage disposed within the second interior space and configured to support a substrate therein; and
   a plurality of gas injectors installed on the ring-shaped radiator and radially spaced apart from each other,
   wherein each of the plurality of gas injectors is directly contacted by a corresponding heating element of the ring-shaped radiator on opposite sides thereof such that the process gas is heated as it moves through a flow path of each of the plurality of gas injectors, wherein the ring-shaped radiator is configured to heat the first interior space to a first temperature while the plasma is generated in the first interior space, and wherein the insulating plate is configured to thermally insulate the second interior space from the first interior space such that a temperature of the second interior space is maintained lower than the first temperature of the first interior space while the plasma is generated in the first interior space.

2. The semiconductor manufacturing apparatus of claim 1, further comprising:
a reflective plate disposed on the insulating plate and configured to block radiation heat transfer between the first interior space and the second interior space.

3. The semiconductor manufacturing apparatus of claim 1, wherein the plurality of gas injectors is configured to inject the process gas supplied from the gas supply into the first interior space and towards the center of the process chamber.

4. The semiconductor manufacturing apparatus of claim 1, wherein the insulating plate comprises an enclosed air pocket disposed therein, the air pocket filled with air.

5. The semiconductor manufacturing apparatus of claim 1, wherein the stage comprises a stage heater configured to heat the substrate while it is supported on the stage.

6. The semiconductor manufacturing apparatus of claim 5, wherein the stage heater is configured to heat the substrate to a second interior temperature that is less than the first temperature.

7. The semiconductor manufacturing apparatus of claim 6, wherein the first temperature is between about 700° C. to about 1200° C., inclusive and the second temperature is between about 100° C. and about 600° C., inclusive.

8. The semiconductor manufacturing apparatus of claim 1,
wherein the plasma generator is configured to generate an inductively coupled plasma, a capacitively coupled plasma, or a microwave plasma.

9. The semiconductor manufacturing apparatus of claim 1, wherein the insulating plate includes a low thermal conductivity material that thermally isolates the first interior space of the process chamber that includes the heating element from the second interior space of the process chamber that includes the stage.

10. The semiconductor manufacturing apparatus of claim 9, wherein the low thermal conductivity material includes ceramic or quartz.

11. The semiconductor manufacturing apparatus of claim 1, wherein each of the heating elements of the ring-shaped radiator comprises a lamp, an ultraviolet (UV) light source, a light-emitting diode (LED) light source, a laser light source, or a hot wire.

12. A semiconductor manufacturing apparatus, comprising:
a process chamber;
an insulating plate dividing an interior space of the process chamber into a first interior space, in which plasma is generated, and a second interior space, in which the plasma generated in the first interior space is diffused;
a gas supply configured to supply a process gas to the first interior space;
a plasma generator configured to generate plasma from the process gas supplied to the first interior space;
a ring-shaped radiator configured to heat the first interior space to a first temperature while the plasma is generated in the first interior space;
a stage configured to support a substrate within the second space and including a stage heater that is configured to heat the substrate to a second interior temperature that is less than the first temperature; and
a plurality of gas injectors installed on the ring-shaped radiator and radially spaced apart from each other,
wherein each of the plurality of gas injectors is directly contacted by a corresponding heating element of the ring-shaped radiator on opposite sides thereof such that the process gas is heated as it moves through a flow path of each of the plurality of gas injectors, and
wherein the insulating plate is configured to thermally insulate the second interior space from the first interior space such that a temperature of the second interior space is maintained lower than the first temperature of the first interior space while the plasma is generated in the first interior space.

13. The semiconductor manufacturing apparatus of claim 12, further comprising:
a reflective plate disposed on the insulating plate,
wherein the reflective plate comprises a second through hole communicating with a first through hole in the insulating plate.

14. The semiconductor manufacturing apparatus of claim 12, wherein the plurality of gas injectors is configured to inject the process gas supplied from the gas supply through the ring-shaped radiator into the first interior space.

15. The semiconductor manufacturing apparatus of claim 12,
wherein the stage heater is configured to heat the substrate while the plasma is generated in the first interior space.

16. A semiconductor manufacturing apparatus, comprising:
a process chamber including a first interior space in which plasma is generated and a second interior space in which a substrate is processed;
an insulating plate thermally isolating the first interior space from the second interior space and including a first through hole through which plasma is transmitted from the first interior space to the second interior space;
a gas supply configured to supply a process gas including carbon into the first interior space;
a plasma generator configured to generate plasma, in the first interior space, from the process gas;
a ring-shaped radiator configured to heat the first interior space to a first temperature while the plasma is generated in the first interior space;
a stage configured to support the substrate within the second interior space and including a stage heater that is configured to heat the substrate to a second temperature that is less than the first temperature; and
a plurality of gas injectors installed on the ring-shaped radiator and radially spaced apart from each other,
wherein each of the plurality of gas injectors is directly contacted by a corresponding heating element of the ring-shaped radiator on opposite sides thereof such that the process gas is heated as it moves through a flow path of each of the plurality of gas injectors, and
wherein the insulating plate is configured to thermally insulate the second interior space from the first interior space such that a temperature of the second interior space is maintained lower than the first temperature of the first interior space while the plasma is generated in the first interior space.

17. The semiconductor manufacturing apparatus of claim 16, further comprising:
a reflective plate provided on the insulating plate and configured to block radiation heat transfer between the first interior space and the second interior space,
wherein the reflective plate comprises at least one second through hole through which plasma is transmitted from the first interior space to the second interior space.

18. The semiconductor manufacturing apparatus of claim 16, wherein the plurality of gas injectors is configured to inject the process gas supplied from the gas supply into the first interior space, and
wherein the plurality of gas injectors is configured to inject the process gas, heated by the ring-shaped radiator, into the first interior space.

* * * * *